United States Patent
Sun et al.

(10) Patent No.: US 6,858,540 B2
(45) Date of Patent: Feb. 22, 2005

(54) SELECTIVE REMOVAL OF TANTALUM-CONTAINING BARRIER LAYER DURING METAL CMP

(75) Inventors: Lizhong Sun, San Jose, CA (US); Stan Tsai, Fremont, CA (US); Shijian Li, San Jose, CA (US); Fred C. Redeker, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 156 days.

(21) Appl. No.: 10/215,521

(22) Filed: Aug. 8, 2002

(65) Prior Publication Data

US 2003/0022801 A1 Jan. 30, 2003

Related U.S. Application Data

(62) Division of application No. 09/569,968, filed on May 11, 2000, now abandoned.

(51) Int. Cl.$^7$ ........................ C09K 13/00; H01L 21/302; B24B 1/00
(52) U.S. Cl. ........................ 438/693; 438/692; 510/175; 252/79.1
(58) Field of Search ................................ 438/693, 692; 252/79.1, 79.2, 79.3; 510/175, 176; 106/3; 216/89; H01L 21/302

(56) References Cited

U.S. PATENT DOCUMENTS 4,851,201 A * 7/1989 Heap et al. .................. 423/235
4,920,031 A    4/1990 Ohno et al. .................. 430/522

(List continued on next page.)

FOREIGN PATENT DOCUMENTS

EP          1 006 166 A1    6/2000    ............. C09G/1/02
EP          1 011 131        6/2000    ......... H01L/21/321

(List continued on next page.)

OTHER PUBLICATIONS

US 5,985,755, 11/1999, Bajaj et al. (withdrawn)
Written Opinion from PCT International Preliminary Examining Authority for US/02/00062, dated May 12, 2003.
Partial Search Report (Form PCT/ISA/206—Annex) for PCT/US02/22126, dated Dec. 6, 2002.
PCT International Search Report from International Application No. PCT/US01/50150, Dated Sep. 23, 2002.
International Search Report dated Jul. 8, 2002 for PCT/US02/00062.
U.S. Appl. No. 09/569,968, filed May 11, 2000, (Sun, et al.).
U.S. Appl. No. 09/968,863, filed Oct. 27, 2000, (Tsai, et al.).
U.S. Appl. No. 09/968,864, filed Oct. 27, 2000, (Sun et al.).
U.S. Appl. No. 09/755,717, filed Jan. 5, 2001, (Sun, et al.).
U.S. Appl. No. 10/187,857, filed Jun. 27, 2002, (Tsai, et al.).
U.S. Appl. No. 10/193,810, filed Jul. 11, 2002, (Tsai, et al.).

*Primary Examiner*—Gregory Webb
(74) *Attorney, Agent, or Firm*—Moser, Patterson & Sheridan

(57) ABSTRACT

A method for performing chemical-mechanical polishing/planarization providing highly selective, rapid removal of a Ta-containing barrier layer from a workpiece surface, such as a semiconductor wafer including a damascene-type Cu-based metallization pattern in-laid in a dielectric layer and including a Ta-containing metal diffusion barrier layer, comprises applying an aqueous liquid composition to the workpiece surface during CMP or to the polishing pad utilized for performing the CMP, the composition comprising at least one reducing agent for reducing transition metal ions to a lower valence state, at least one pH adjusting agent, at least one metal corrosion inhibitor, and water, and optionally includes ions of at least one transition metal, e.g., Cu and Fe ions. According to another embodiment, the aqueous liquid composition contains Ag ions and the at least one reducing agent is omitted.

34 Claims, 1 Drawing Sheet

U.S. PATENT DOCUMENTS

| | | | |
|---|---|---|---|
| 5,053,339 A * | 10/1991 | Patel ............................... 436/2 |
| 5,340,370 A | 8/1994 | Cadien et al. ................. 51/308 |
| 5,676,587 A | 10/1997 | Landers et al. .............. 451/157 |
| 5,693,563 A | 12/1997 | Teong ......................... 437/190 |
| 5,735,963 A | 4/1998 | Obeng ........................... 134/3 |
| 5,783,489 A | 7/1998 | Kaufman et al. ............ 438/692 |
| 5,842,910 A | 12/1998 | Krywanczyk et al. ......... 451/41 |
| 5,893,796 A | 4/1999 | Birang et al. ................ 451/526 |
| 5,954,997 A | 9/1999 | Kaufman et al. ............ 252/79.1 |
| 5,981,454 A | 11/1999 | Small ........................... 510/175 |
| 5,985,748 A | 11/1999 | Watts et al. .................. 438/622 |
| 6,001,730 A | 12/1999 | Farkas et al. ................ 438/627 |
| 6,074,949 A | 6/2000 | Schonauer et al. .......... 438/692 |
| 6,083,840 A | 7/2000 | Mravic et al. ............... 438/693 |
| 6,117,775 A | 9/2000 | Kondo et al. ................ 438/690 |
| 6,117,783 A | 9/2000 | Small et al. ................. 438/693 |
| 6,126,853 A * | 10/2000 | Kaufman et al. ........... 252/79.1 |
| 6,136,714 A | 10/2000 | Schutz ......................... 438/692 |
| 6,143,656 A | 11/2000 | Yang et al. .................. 438/687 |
| 6,156,661 A | 12/2000 | Small .......................... 438/692 |
| 6,183,686 B1 | 2/2001 | Bardus et al. .................. 419/8 |
| 6,218,290 B1 | 4/2001 | Schonauer et al. .......... 438/633 |
| 6,258,721 B1 | 7/2001 | Li et al. ....................... 438/693 |
| 6,271,416 B1 | 8/2001 | Takagaki et al. ............. 562/433 |
| 6,315,803 B1 * | 11/2001 | Ina et al. ....................... 51/307 |
| 6,375,559 B1 | 4/2002 | James et al. ................. 451/527 |
| 6,468,913 B1 * | 10/2002 | Pasqualoni et al. .......... 438/693 |
| 6,709,316 B1 * | 3/2004 | Sun et al. ...................... 451/41 |
| 2002/0090820 A1 | 7/2002 | Sun et al. ..................... 438/690 |

FOREIGN PATENT DOCUMENTS

| | | | |
|---|---|---|---|
| EP | 1 085 067 | 3/2001 | ............ C09G/1/02 |
| EP | 1 104 020 A1 | 5/2001 | ......... H01L/21/768 |
| EP | 1 125 999 A1 | 8/2001 | ............ C09G/1/02 |
| FR | 1 603 558 | 6/2001 | ............ C23G/1/00 |
| JP | 2001-127018 | 5/2001 | ......... H01L/21/304 |
| JP | 2001-139937 | 5/2001 | ............ C09K/3/14 |
| WO | WO 98/04646 | 2/1998 | ........... C09K/13/00 |
| WO | WO 98/36045 | 8/1998 | ............ C11D/3/18 |
| WO | 98/41671 | 9/1998 | ............ C23F/1/14 |
| WO | 98/49723 | 11/1998 | ......... H01L/21/321 |
| WO | WO 00/00561 | 1/2000 | ............ C09G/1/02 |
| WO | 00/02238 | 1/2000 | ............ H01L/21/02 |
| WO | WO 00/24842 | 5/2000 | ............ C09K/3/14 |
| WO | 00/30159 | 5/2000 | ............ H01L/21/00 |

* cited by examiner

SELECTIVE REMOVAL OF TANTALUM-CONTAINING BARRIER LAYER DURING METAL CMP

This is a divisional of application(s) Ser. No. 09/569,968 filed on May 11, 2000 now abandoned.

FIELD OF THE INVENTION

The present invention relates to a composition and method for performing chemical-mechanical polishing/planarization (CMP), which composition and method enjoy particular utility in the manufacture of semiconductor integrated circuit (IC) devices.

BACKGROUND OF THE INVENTION

Chemical-mechanical polishing/planarization (CMP) techniques, compositions, and apparatus therefor have been developed for providing smooth topographies, particularly on the surfaces of layers deposited on semiconductor substrates during integrated circuit (IC) device manufacture. In such instances, rough surface topography results when metal conductor lines are formed over a substrate containing device circuitry, e.g., inter-level metallization patterns comprising a plurality of electrically conductive lines which may, inter alia, serve to interconnect discrete devices formed within the substrate. The metal conductor lines are insulated from each other and from vertically adjacent interconnection levels by thin layers of dielectric insulation material, termed "interlayer dielectric" (abbreviated as "ILD") or "intermetal dielectric" (abbreviated as "IMD"), and openings formed through the ILD or IMD layers provide electrical interconnection and access between successive such interconnection levels. In fabricating such type devices including multiple interconnection and ILD or IMD layers, it is desirable that the metallic and dielectric insulation layers have a smooth topography, inasmuch as it is very difficult to photolithographically image and pattern layers applied to rough surfaces. CMP techniques and methodology can also be employed for removing different layers of material from the surface of a semiconductor substrate, as for example, following via hole formation in an ILD or IMD layer, when a metallization layer is deposited to fill the via hole and then CMP is used to form planar metal via plugs embedded in the ILD layer.

Briefly, CMP processes utilized in semiconductor device manufacture involve mounting a thin flat workpiece, e.g., a semiconductor wafer substrate, on a carrier or polishing head, with the surface to be polished/planarized being exposed. The substrate surface is then urged against a wetted polishing/planarizing surface, i.e., a pad, under controlled mechanical pressure, chemical, and temperature conditions. In addition, the carrier head may translate or rotate to provide relative motion between the substrate and polishing pad surfaces. A polishing composition, typically but not exclusively, in the form of a slurry containing a polishing agent, such as finely-dimensioned alumina ($Al_2O_3$), silica ($SiO_2$), or ceria ($CeO_2$) particles, is used for facilitating material removal. Typically, the polishing composition additionally contains a number of chemicals, depending upon the material(s) to be polished, including pH adjusting and stabilizing agents, as well as chemical oxidizing agents for chemically reacting with various components of the surface being polished/planarized. The combination of mechanical and chemical interaction of surface material during the polishing/planarization process results in superior polishing/planarization of the surface being worked on, vis-à-vis other polishing/planarization techniques.

CMP, as described above, may be conducted with either a high or a low selectivity with respect to the particular layer or material being removed by the polishing/planarization process. When CMP is performed with high selectivity, the removal rate of the selected material is significantly higher than that of other material(s) exposed at the surface of the workpiece being polished. Conversely, when CMP is performed with low selectivity, each material present on or at the workpiece surface being polished is removed at substantially the same rate.

The escalating requirements for high integration density and performance associated with the manufacture of ultra-large scale integration semiconductor devices necessitate responsive changes in interconnection ("back end") technology. As a consequence, copper (Cu) and Cu-based alloys (the symbol Cu as employed in the present disclosure refers to high purity, elemental copper and the expression "Cu-based alloys" refers to alloys containing at least about 80 wt. % copper), have received considerable attention as replacement materials for replacing conventional metal interconnect materials, e.g., aluminum (Al) and Al-based alloys, in view of, inter alia, their low cost and increased resistance to electromigration.

However, due to the tendency for deleterious diffusion of Cu atoms and/or ions into neighboring ILD or IMD (e.g., silicon dioxide, $SiO_2$) and semiconductor (e.g., silicon, Si) layers, it is necessary to provide a thin diffusion barrier layer between Cu and Cu-based alloy metallization features and adjacent ILD or IMD and/or semiconductor layers. Currently, tantalum (Ta)-containing layers, e.g., elemental Ta and tantalum nitride (TaN), are most commonly employed for this purpose.

As for CMP processing for polishing/planarization of such Cu or Cu-based alloy metallization/interconnection systems including Ta or TaN diffusion barrier layers which effectively encapsulate the Cu or Cu-based alloy metallization features, a high selectivity CMP process, such as described above, advantageously removes the Cu or Cu-based alloy with little or no concurrent loss of the Ta or TaN barrier layer or ILD or IMD material (e.g., $SiO_2$), whereas a low selectivity CMP process, as described above, disadvantageously incurs a significant concurrent loss of Ta, TaN, and $SiO_2$. However, conventional high selectivity CMP processing frequently results in excessive polishing of portions of the metal features on wide metal lines, e.g., 50 μm wide Cu lines, leading to formation of concavities or depressions in the polished surface, termed "dishing". However, if a high selectivity CMP process is performed only on very narrow metal lines, e.g., Ta-containing vertical barriers typically about 0.025 μm thick between dielectric insulator and Cu features, Ta-containing barrier layer dishing is negligible. The advantages of high selectivity CMP of Ta-containing barrier layers are not only low oxide loss and low metal loss, but also substantial reduction of dishing which typically occurs in the previous polishing steps. On the other hand, current CMP processes and commercially available slurries for barrier layer removal are limited as to useful chemical composition of the slurry because of the relatively inert nature of Ta and its compounds, such as TaN, and consequently, rely predominantly on strong mechanical abrasion. Stated somewhat differently, the currently available CMP processes and compositions with high solids concentrations for workpieces with Ta-containing barrier layers have either:

(a) very poor selectivity among the barrier layer (e.g., Ta- or TaN-based), metal layer (Cu-based), and the ILD or IMD layer (silicon oxide-based), resulting in excessive concurrent removal of the metal and ILD or IMD layers; or (b) a very slow barrier layer removal rate at low pH, which is adverse with respect to surface roughness and Cu corrosion.

Accordingly, there exists a need for a simple and reliable method and composition for performing CMP in the manufacture of semiconductor IC devices employing Cu-based metallization systems including Ta-containing barrier layers, which method and composition are free of the disadvantages and drawbacks associated with the conventional CMP methodologies described above, and are fully compatible with the economic and throughput requirements of large-scale, automated semiconductor manufacture processing.

The present invention addresses and solves the above-described problems attendant upon the manufacture of semiconductor IC devices including Cu-based metallization systems with Ta-containing barrier layers according to conventional CMP methodology utilizing abrasive slurries and is fully compatible with all other mechanical and chemical aspects of CMP processing for polishing/planarization.

DISCLOSURE OF THE INVENTION

An aspect of the present invention is an improved method for selective removal by CMP of a Ta-containing barrier layer from the surface of a workpiece.

Another aspect of the present invention is an improved method for selective removal by CMP of a Ta-containing barrier layer forming part of a Cu-based metallization system.

Yet another aspect of the present invention is an improved method for performing selective removal of a Ta-containing barrier layer by CMP processing utilizing a non-abrasive or only slightly abrasive, aqueous polishing composition.

Still another aspect of the present invention is an improved non-abrasive or only slightly abrasive, aqueous composition suitable for removal of a Ta-containing barrier layer.

A yet another aspect of the present invention is an improved non-abrasive or only slightly abrasive aqueous composition utilizable in CMP processing of semiconductor integrated circuit devices for selective removal of Ta-containing barrier layers in Cu-based metallization systems.

Additional aspects and other features of the present invention will be set forth in the description which follows and in part will become apparent to those having ordinary skill in the art upon examination of the following or may be learned from the practice of the invention. The various aspects of the present invention may be realized and obtained as particularly pointed out in the appended claims.

According to one aspect of the present invention, the foregoing and other aspects are achieved in part by a method for selective removal of a tantalum (Ta)-containing barrier layer from a workpiece, comprising the steps of:

(a) providing a workpiece comprising a surface having a film stack thereon including a Ta-containing film or barrier layer;

(b) subjecting the film stack on the workpiece surface to chemical-mechanical polishing (CMP) to selectively and completely remove all material therefrom except for the Ta-containing film or barrier layer, followed by rinsing of the workpiece, e.g., with water, to remove CMP debris and/or residue;

(c) applying an aqueous liquid composition to the workpiece surface or to the polishing pad utilized for performing CMP of the workpiece surface, the composition comprising:

at least one reducing agent for reducing ions of at least one transition metal to a lower valence state;

at least one pH adjusting agent;

at least one metal corrosion inhibitor; and water; and (d) subjecting the workpiece surface to CMP to selectively remove the Ta-containing barrier layer, wherein:

the ions of the at least one transition metal are either contained in the aqueous liquid composition when the composition is applied to the workpiece surface or to the polishing pad or are introduced into the composition subsequent to its application to the workpiece surface or to the polishing pad.

According to embodiments of the present invention, the ions of the at least one transition metal are contained in the aqueous liquid composition when the composition is applied to the workpiece surface or to the polishing pad. According to particular embodiments of the present invention, the liquid composition applied to the workpiece surface or to the polishing pad includes at least one of copper (Cu) and iron (Fe) ions as the ions of the at least one transition metal.

According to another embodiment of the present invention, the liquid composition applied to the workpiece surface or to the polishing pad includes only silver (Ag) ions as transition metal ions and the reducing agent(s) is (are) omitted from the composition.

According to further embodiments of the present invention, the ions of the at least one transition metal are introduced into the liquid composition subsequent to its application to the workpiece surface or to the polishing pad. According to particular embodiments, Cu ions are introduced into the liquid composition as transition metal ions subsequent to its application to the workpiece surface or to the polishing pad. According to one variant, the Cu ions are generated by an in situ process and introduced into the liquid composition during step (d) comprising CMP processing of a workpiece comprising a damascene-type in-laid, Cu-based metallization structure. According to other variants, Cu ions are generated by ex situ processes and introduced into the liquid composition either by performing a preliminary step comprising pre-conditioning the polishing pad with a Cu wafer or by adding Cu ions to the liquid composition.

According to still further embodiments of the present invention, when the composition includes the at least one reducing agent, the latter is (are) present in an amount ranging from about 0.005 to about 10 wt. %, e.g., from about 0.1 to about 3 wt. %, and may be selected from hydroxylamine, glucose, thiosulfate, and potassium iodide. The pH of the composition, regardless of whether or not the at least one reducing agent is present, is from about 8.0 to about 12.0, e.g., about 9.0 to 11.5; and each composition may, according to the invention, further include up to about 10 wt. % of abrasive particles, e.g., about 0.3 to about 1.0 wt. % of abrasive particles, which particles may, for example, be selected from silica ($SiO_2$), alumina ($Al_2O_3$), and titania ($TiO_2$) particles; and the compositions may still further include at least one of the following: about 0.1 to about 8 wt. % of at least one buffering agent, e.g., selected from alkali metal bicarbonate and tetraborate salts; about 0.01 to about 0.5 wt. % of at least one chelating agent, e.g., comprising carboxylate and amino groups; and up to about 2.0 wt. % of the at least one metal corrosion inhibitor, e.g., selected from organic compounds comprising at least one azole group.

According to yet further embodiments of the present invention, step (a) comprises providing as the workpiece a semiconductor wafer substrate having a dielectric layer formed on the wafer surface, and the Ta-containing barrier layer comprises a tantalum (Ta) or tantalum nitride (TaN) barrier layer formed on the surface of the dielectric layer; the semiconductor wafer substrate further includes a damascene-type in-laid metallization structure or system comprising at least one recess formed in the surface of the dielectric layer, the Ta or TaN barrier layer extending over the sidewall and bottom surfaces of the recess, and the recess is filled with a metallic material forming a metallization feature.

According to embodiments of the present invention, the metallic material of the metallization feature comprises Cu or a Cu-based alloy and the Ta or TaN layer forms a barrier against diffusion of Cu ions from the metallization feature into the dielectric layer and/or the semiconductor substrate.

According to another aspect of the present invention, an aqueous liquid composition suitable for use in CMP processing for selective removal of a Ta-containing barrier layer (e.g., of Ta or TaN) from the surface of an ILD or IMD layer during metallization processing of semiconductor IC devices comprises:

at least one reducing agent for reducing ions of at least one transition metal to a lower valence state;

at least one pH adjusting agent for providing the composition with an alkaline pH; at least one metal corrosion inhibitor; and water.

According to embodiments of the present invention, the composition further includes ions of the at least one transition metal. According to particular embodiments, the ions of the at least one transition metal are selected from Cu and Fe ions; the at least one reducing agent for the transition ions is present in an amount of from about 0.005 to about 10 wt. %, e.g., from about 0.1 to about 3 wt. %, and is (are) selected from hydroxylamine, glucose, thiosulfate, and potassium iodide; the alkaline pH of the composition is from about 8.0 to about 12.0, e.g., about 9.0 to about 11.5; the composition may optionally include up to about 10 wt. % abrasive particles, e.g., about 0.3 to about 1.0 wt. % of abrasive particles selected from $SiO_2$, $Al_2O_3$, and $TiO_2$ particles; about 0.1 to about 8 wt. % of at least one pH buffering agent, e.g., selected from alkali metal bicarbonate and tetraborate-tetrahydrate salts; about 0.01 to about 0.5 wt. % of at least one chelating agent, e.g., comprising carboxylate and/or amino groups; and the at least one metal corrosion inhibitor is present in an amount up to about 2.0 wt. %. According to particular embodiments, the at least one metal corrosion inhibitor is a Cu corrosion inhibitor, e.g., an organic compound comprising at least one azole group.

According to other embodiments of the present invention, the liquid composition includes silver (Ag) ions as transition metal ions and the reducing agent(s) is (are) omitted from the composition. The at least one metal corrosion inhibitor and alkaline pH range of the Ag-containing composition are the same as described above for use with, e.g., Cu and Fe ions as transition metal ions, and any or all of the above-mentioned optional components utilized with the reducing agent-containing compositions may also be present in similar amount(s).

Additional aspects of the present invention will become readily apparent to those skilled in the art from the following detailed description, wherein only the preferred embodiment of the present invention is shown and described, simply by way of illustration of the best mode contemplated for carrying out the present invention. As will be described, the present invention is capable of other and different embodiments, and its several details are capable of modification in various obvious respects, all without departing from the present invention. Accordingly, the drawing and description are to be regarded as illustrative in nature, and not as limitative.

BRIEF DESCRIPTION OF THE DRAWINGS

The following detailed description of the embodiment of the present invention can best be understood when read in conjunction with the following drawings, in which like reference numerals are employed throughout to designate similar features, wherein.

DESCRIPTION OF THE INVENTION

Figure 1:
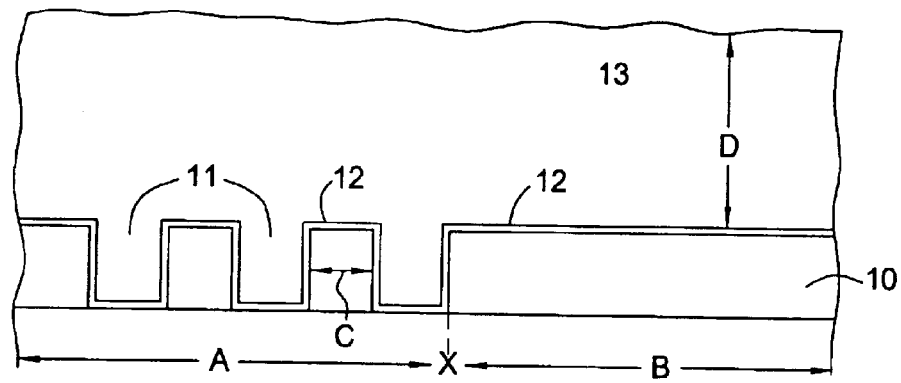
FIGS. 1–3 schematically illustrate, in cross-sectional view, sequential phases during formation, by CMP, of a damascene-type, in-laid metallization structure or system according to an embodiment of the present invention.

The present invention is based upon the discovery that chemical-mechanical polishing/planarization of workpiece surfaces, e.g., semiconductor wafer substrates having electrically conductive patterns ("metallization") formed on and/or within a dielectric layer (ILD or IMD) overlying the surface of the semiconductor wafer and including a tantalum (Ta)-containing barrier layer for preventing deleterious diffusion of metal ions, e.g., copper (Cu) ions, from the metallization pattern into the dielectric layer and/or the underlying semiconductor wafer, can be performed to selectively remove the Ta-containing barrier layer, without use of abrasive slurries and with minimal loss of the metal and ILD or IMD layers. Moreover, the inventive methodology and composition advantageously facilitates performing CMP of Ta-containing barrier layers with very low loss of the dielectric material of the ILD or IMD layer, e.g., silicon dioxide ($SiO_2$) and the metallization material, e.g., Cu or Cu-based alloy, at low cost and at relatively high Ta removal rates (e.g., about 750 to about 1,250 Å/min.) consistent with the throughput requirements of large-scale, automated semiconductor manufacture.

Briefly stated, according to the present invention, in a preliminary step, CMP of a damascene-type, in-laid metallization pattern or system comprising Cu or Cu-alloy based electrical conductors embedded in recesses formed in an ILD or IMD layer, e.g., of a silicon oxide such as $SiO_2$, and including a Ta-containing barrier layer, e.g., of Ta or TaN, lining the sidewall and bottom surfaces of the recesses and covering the upper surfaces of the ILD or IMD layer, is performed in normal fashion, as by use of an abrasive-containing slurry or by use of a polishing solution together with a fixed abrasive pad, to remove the blanket or over-burden layer of Cu or Cu-based alloy formed during the filling of the recesses, thereby providing a workpiece surface comprised of thin layers of Ta-containing barrier layer material overlying the ILD or IMD layer, interspersed with in-laid Cu or Cu-based alloy metallization features. According to the invention, highly selective removal by CMP of the exposed Ta-containing barrier layers is then performed at a relatively high Ta removal rate (about 750 to about 1,250 Å/min.), low ILD (or IMD) and Cu loss, and good uniformity with the aid of a novel, low cost, aqueous liquid CMP composition which is abrasive-free or contains only a small amount (e.g., <1.0 wt. %) of abrasive particles, the composition comprising ions of at least one transition metal (or only Ag ions according to one embodiment) in (an) amount sufficient to facilitate CMP of the Ta-containing barrier layer material; at least one reducing agent for reducing the ions of the at least one transition metal (the reducing agent being omitted when only Ag ions are present as the transition metal ions); at least one pH adjusting agent for providing the composition with an alkaline pH; at least one metal corrosion inhibitor; and water. In a typical application, according to the invention, selectivity of CMP among Ta or TaN barrier layer material, $SiO_2$ ILD or IMD material, and Cu, is about 10:1:1.

Figure 2:
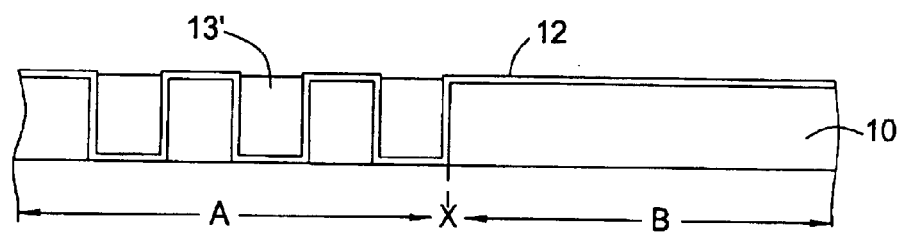
Figure 3:
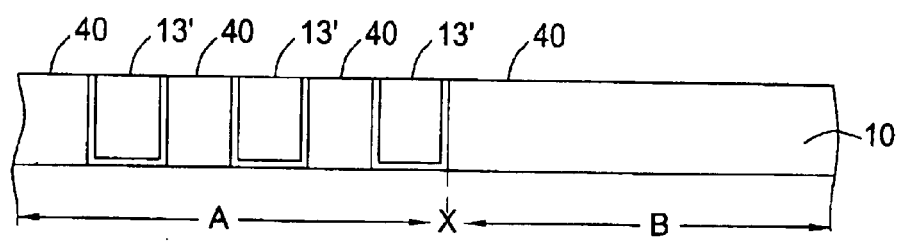

Referring now to FIGS. 1–3, shown therein, by way of illustration, but not limitation, are schematic cross-sectional views of sequential phases during a process for formation of a damascene-type, in-laid metallization pattern utilizing the CMP composition and methodology of the present invention.

Referring particularly to FIG. 1, an ILD or IMD layer 10, e.g., of a silicon oxide, such as $SiO_2$, is formed as to overlie a semiconductor substrate (not shown in the figure for illustrative simplicity), e.g., a wafer of silicon (Si) or GaAs. A plurality of recesses 11, such as grooves, trenches, or via openings, are formed (by known techniques not described herein in order not to unnecessarily obscure the thrust of the present invention) in a preselected area A in which an array of closely spaced-apart conductive lines, for constituting a desired metallization pattern, are to be formed so as to border upon open field B. A Ta-containing diffusion barrier layer 12, e.g., of Ta or TaN, is deposited (by suitable techniques not described herein for brevity) as to line the sidewall and lower surfaces of the recesses 11 and cover the upper surface of the ILD layer 10. Typically, the openings 11 are spaced apart by a distance C less than about 1 μm, e.g., about 0.2 μm. A Cu-based layer 13, i.e., of pure or alloyed Cu, is then deposited to fill recesses 11 and cover the upper surface of the Ta-containing barrier layer 12 as a blanket or overburden layer having a thickness D of about 8,000–12,000 Å.

Adverting to FIG. 2, in a preliminary step according to the present invention, high selectivity CMP of the Cu-based blanket or overburden layer 13 is performed in conventional fashion utilizing at least one abrasive slurry or polishing solution, in single or multiple steps, to remove layer 13 with high selectivity against the Ta-containing barrier layer 12 to form metallization features 13'. CMP may not stop at the upper surface of the barrier layer 12, leaving the upper workpiece surface comprised of barrier layer portions 12 and interspersed Cu metallization features 13', with some dishing. If necessary, some overpolishing by CMP may be performed to ensure complete removal of the overburden layer 13 overlying the barrier layer 12. Some increased dishing of the Cu layer can occur in the form of (a) recess(es) in the Cu features 13' in the trenches overlying the surface of the Ta-containing barrier layer 12.

According to the present invention, CMP is then performed on the upper, exposed surfaces 12, 13' of the preliminary stage or structure shown in FIG. 2, utilizing an aqueous liquid composition which is abrasive-free, or has a low abrasive particle concentration (<1.0 wt. %), which is applied to the upper surface of the workpiece or to the polishing pad utilized for performing CMP of the workpiece surface, the composition comprising:
at least one reducing agent for reducing ions of at least one transition metal to a lower valence state;
at least one pH adjusting agent for providing the composition with an alkaline pH; at least one metal corrosion inhibitor; and
water.

Ions of the at least one transition metal are either contained in the aqueous liquid composition when the composition is applied to the workpiece surface or to the polishing pad, or are introduced into the composition subsequent to its application to the workpiece surface or to the polishing pad.

The composition may optionally further comprise at least one of the following:
abrasive particles;
at least one pH buffering agent; and
at least one metal chelating agent.

Alternatively, the aqueous liquid composition may contain Ag ions only as the transition metal ions, in which instance the at least one reducing agent is omitted. Any or all of the above-listed optional components may be present in similar amount(s).

The polishing pad utilized during the selective CMP of the Ta-containing barrier layer material may be any of those commercially available, such as an IC-1000 or Politex pad (available from Rodel, Inc., Newark, Del.), or a fixed abrasive pad.

According to the invention, the Ta or TaN barrier layer portions 12 exposed at the surface of the workpiece are rapidly and selectively removed by CMP utilizing the inventive compositions to yield the polished, planarized structure shown in FIG. 3 comprising a dense array of Cu-based metallization features A or 13' bordered by an open field B. The upper surface 40 of the resultant structure exhibits a high degree of planarity with minimal loss of either the ILD or IMD layer material (e.g., $SiO_2$) or Cu-based metallization material from features A (or 13').

During the CMP, the exposed, upper surface portions of the in-laid, Cu-based metallization features which extend above the upper surface of the ILD or IMD layer 10 are removed, whereby a small amount of $Cu^{2+}$ ions (i.e., transition metal ions) are initially formed and then converted to a lower valence state ($Cu^+$) by means of the at least one reducing agent present in the composition. As a consequence of the Cu ion formation, according to embodiments of the present invention, in applications wherein the metallization pattern to be polished/planarized is Cu-based, the liquid composition applied to the workpiece surface for performing selective CMP of the Ta-containing barrier layer need not contain transition metal ions, e.g., Cu ions, when applied, inasmuch as the requisite Cu transition metal ions are formed in situ during the CMP and supplied to the composition for use in CMP of the Ta-containing barrier layer. According to alternative embodiments of the present invention, the requisite Cu transition metal ions may be supplied to the composition in an ex situ manner via a pre-conditioning treatment utilizing a Cu disk urged into contact with the polishing pad, or by addition of Cu ions to the composition utilized for removal of the Ta-containing barrier layer.

According to embodiments of the invention, suitable transition metal ions for use in performing selective CMP of Ta-containing barrier layers include, but are not limited to, copper (Cu) and iron (Fe) ions; the composition includes from about 0.005 to about 10 wt. % of at least one reducing agent, by way of example, selected from hydroxylamine, glucose, thiosulfate, and potassium iodide; the at least one pH adjusting agent is present at a concentration sufficient to provide the composition with an alkaline pH of from about 8.0 to about 12.0, for example, about 9.0 to about 11.5; and up to about 2.0 wt. % of a metal corrosion inhibitor, e.g., organic compounds comprising at least one azole group, such as benzotriazo, for moderating metal loss, e.g., of Cu, during the selective CMP. The composition may, if desired in order to enhance the removal rate, also contain a small amount of abrasive particles, e.g., up to about 10 wt. % of abrasive particles, typically about 0.3 to about 1.0 wt. % of abrasive particles, such as of silica ($SiO_2$), alumina ($Al_2O_3$), or titania ($TiO_2$).

According to other embodiments of the invention, the composition contains only silver (Ag) ions as the transition metal ions, and the reducing agent(s) is (are) omitted.

Functionality of either type of composition (i.e., with and without at least one reducing agent) may be improved by further including therein one or more of the following: about 0.1 to about 8 wt. % of at least one buffering agent, e.g., an alkali metal bicarbonate and tetraborate-tetrahydrate salts; and about 0.01 to about 0.5 wt. % of at least one metal chelating agent comprising, for example, carboxylate and/or amino groups.

Conventional semiconductor substrates and ILD or IMD layer materials may be employed in the practice of the present invention. For example, the semiconductor substrate may comprise doped monocrystalline silicon (Si) or GaAs. The ILD or IMD layer(s) can comprise any of various dielectric materials conventionally employed in the manufacture of semiconductor devices employing metallization patterns e.g., multi-level metallizations. For example, dielectric materials usable in the practice of the present invention include silicon dioxide ($SiO_2$), phospho-silicate glass (PSG), borophosphosilicate glass (BPSG), and silicon oxides derived from tetraethyl orthosilicate (TEOS) or silane by plasma enhanced chemical vapor deposition (PECVD). The ILD or IMD layer(s) can also comprise low k dielectric materials, including polymers such as polyimides, and carbon-containing silicon dioxide.

The operative mechanism by which the inventive composition facilitates rapid and selective planarization by CMP of Ta-containing barrier layers is not known with certainty. However, it is believed that the problems attendant upon CMP of Ta-containing barriers layers stem from the chemically inert nature of Ta and its compounds. Conventional CMP is predicated upon a combination of chemical reaction and mechanical action (abrasion) for material removal. Since Ta and its pertinent compounds are relatively inert, mechanical abrasion is the predominant mechanism in conventional CMP of Ta-containing layers. However, it is believed that the low valence state transition metal ions of the inventive compositions facilitate CMP of the Ta-containing barrier layer materials, even in the absence of abrasive particles.

A number of advantages are thus provided by the present invention, including, but not limited to: low ILD or IMD layer loss, particularly with $SiO_2$ layers; low metal (e.g., Cu) loss; relatively high Ta removal rates (>750 Å/min.); good uniformity of planarization; abrasive-free or very low concentration of abrasive; and low cost. Moreover, the present invention is compatible with the requirements for manufacturing throughput on a large scale, and is fully compatible with all other aspects of conventional CMP processing technology utilized in the manufacture of high integration density semiconductor devices.

In the previous descriptions, numerous specific details are set forth, such as particular materials, structures, reactants, processes, etc., in order to provide a thorough understanding of the present invention. However, it should be recognized that the present invention can be practiced without resorting to the details specifically set forth. In other instances, well-known processing techniques have not been described in detail in order not to unnecessarily obscure the present invention.

Various embodiments of the present invention are shown and described herein. It is to be understood that the present invention is capable of changes and/or modifications within the scope of the inventive concept as expressed herein.

What is claimed is:

1. A method for selective removal of a tantalum containing barrier layer from a workpiece, comprising:
   providing a workpiece comprising a tantalum-containing film or barrier layer;
   applying an aqueous liquid composition to said workpiece surface or to the polishing pad utilized for performing polishing of said workpiece surface, said composition comprising:
   ions of at least one transition metal in a first valence state;
   at least one reducing agent for reducing ions of at least one transition metal from said first valence state to a second valence state lower than said first valence state;
   at least one pH adjusting agent;
   at least one metal corrosion inhibitor;
   water; and
   an alkaline pH; and
   subjecting said workpiece to polishing to selectively remove said tantalum containing film or barrier layer.

2. The method according to claim 1, wherein said ions of said at least one transition metal are contained in said aqueous liquid composition when said composition is applied to said workpiece surface or to said polishing pad.

3. The method according to claim 2, wherein said ions of at least one transition metal comprise at least one of copper (Cu) and iron (Fe) ions.

4. A method for selective removal of a tantalum containing barrier lever from a workpiece, comprising:
   providing a workpiece comprising a tantalum-containing film or barrier layer;
   applying an aqueous liquid composition to said workpiece surface or to the polishing pad utilized for performing polishing of said workpiece surface, said composition comprising:
   ions of at least one transition metal in a first valence state;
   at least one reducing agent for reducing ions of at least one transition metal from said first valence state to a second valence state lower than said first valence state;
   at least one pH adjusting agent;
   at least one metal corrosion inhibitor;
   water; and
   subjecting said workpiece to polishing to selectively remove said tantalum containing film or barrier layer, wherein said ions of said at least one transition metal are introduced into said liquid composition subsequent to its application to said workpiece surface or to said polishing pad.

5. The method according to claim 4, wherein said ions of at least one transition metal comprise copper (Cu) ions.

6. The method according to claim 5, wherein said copper (Cu) ions are generated by an in situ process and introduced into said liquid composition during polishing said workpiece comprising a damascene-type in-laid copper-based metallization structure.

7. The method according to claim 5, wherein said copper (Cu) ions are generated by an ex situ process and introduced into said liquid composition via a preliminary step of pre-conditioning said polishing pad with a Cu disk.

8. The method according to claim 5, wherein said copper (Cu) ions are generated by an ex situ process and introduced into said liquid composition by adding copper (Cu) ions thereto.

9. The method according to claim 1, wherein said composition includes about 0.005 to about 10 wt. % of said at least one reducing agent.

10. The method according to claim 9, wherein said composition includes about 0.1 to about 3 wt. % of said at least one reducing agent.

11. The method according to claim 9, wherein said at least one reducing agent is selected from the group consisting of hydroxylamine, glucose, thiosulfate, and potassium iodide.

12. The method of claim 1, wherein the composition further comprises up to about 10 wt. % of abrasive particles.

13. The method according to claim 12, wherein said composition includes about 0.3 to about 1.0 wt. % of abrasive particles.

14. The method according to claim 12, wherein said abrasive particles are selected from silica ($SiO_2$), alumina ($Al_2O_3$), and titania ($TiO_2$) particles.

15. The method according to claim 12, wherein said composition includes up to about 2.0 wt. % of said at least one metal corrosion inhibitor.

16. The method according to claim 15, wherein said at least one metal corrosion inhibitor is selected from organic compounds comprising at least one azole group.

17. A method for selective removal of a tantalum-containing barrier layer from a workpiece surface, comprising:
provided a workpiece comprising a surface including a tantalum-containing barrier layer;
applying an aqueous liquid composition to said workpiece surface or to the polishing pad utilized for performing polishing of said workpiece surface, said composition comprising:
sliver (Ag) ions in an amount sufficient to facilitate polishing of said tantalum-containing barrier layer;
at least one pH adjusting agent;
at least one metal corrosion inhibitor; and
water; and
subjecting said workpiece surface to polishing to selectively remove said tantalum-containing barrier layer.

18. The method according to claim 17, wherein said composition further includes up to about 10 wt. % abrasive particles.

19. The method according to claim 17, wherein said composition further includes at least one of the following:
about 0.1 to about 8 wt. % of at least one pH buffering agent; and
about 0.01 to about 0.5 wt. % of at least one metal chelating agent.

20. The method according to claim 17, wherein said composition includes up to about 2.0 wt. % of said at least one metal corrosion inhibitor.

21. The method according to claim 4, wherein the composition further comprises up to about 10 wt. % of abrasive particles.

22. The method according to claim 21, wherein said composition includes about 0.3 to about 1.0 wt. % of abrasive particles.

23. The method according to claim 21, wherein said abrasive particles are selected from silica ($SiO_2$), alumina ($Al_2O_3$), and titania ($TiO_2$) particles.

24. The method according to claim 1, wherein said ions of said at least one transition metal are introduced into said liquid composition subsequent to its application to said workpiece surface or to said polishing pad.

25. The method according to claim 24, wherein said ions of at least one transition metal comprise copper (Cu) ions.

26. The method according to claim 25, wherein said ions of said at least one transition metal are generated by an in situ process and introduced into said liquid composition during polishing said workpiece comprising a damascene-type in-laid copper-based metallization structure.

27. The method according to claim 24, wherein said ions of said at least one transition metal are generated by an ex situ process and introduced into said liquid composition via a preliminary step of pre-conditioning said polishing pad with a transition metal disk.

28. The method according to claim 24, wherein said ions of said at least one transition metal are generated by an ex situ process and introduced into said liquid composition by adding said ions of said at least one transition metal thereto.

29. The method according to claim 4, wherein said composition includes about 0.005 to about 10 wt. % of said at least one reducing agent.

30. The method according to claim 29, wherein said composition includes about 0.1 to about 3 wt. % of said at least one reducing agent.

31. The method according to claim 29, wherein said at least one reducing agent is selected from the group consisting of hydroxylamine, glucose, thiosulfate, and potassium iodide.

32. A method for selective removal of a tantalum containing barrier layer from a workpiece, comprising:
providing a workpiece comprising a tantalum-containing film or barrier layer;
applying an aqueous liquid composition to said workpiece surface or to the polishing pad utilized for performing polishing of said workpiece surface, said composition comprising:
ions of at least one transition metal in a first valence state;
at least one reducing agent for reducing ions of at least one transition metal from a first valence state to a second valence state lower than said first valence state, wherein said composition includes about 0.005 to about 10 wt. % of said at least one reducing agent selected from hydroxylamine, glucose, thiosulfate, and potassium iodide;
at least one pH adjusting agent;
at least one metal corrosion inhibitor; and
water; and
subjecting said workpiece to polishing to selectively remove said tantalum containing film or barrier layer.

33. The method according to claim 32, wherein said composition includes about 0.1 to about 3 wt. % of said at least one reducing agent.

34. The method according to claim 32, wherein the composition further comprises up to about 10 wt. % of abrasive particles.

* * * * *